United States Patent
Liu et al.

(10) Patent No.: US 12,142,322 B2
(45) Date of Patent: *Nov. 12, 2024

(54) MEMORY DEVICE AND PROGRAMMING METHOD THEREOF

(71) Applicant: YANGTZE MEMORY TECHNOLOGIES CO., LTD., Wuhan (CN)

(72) Inventors: Hongtao Liu, Wuhan (CN); Ying Huang, Wuhan (CN); Wenzhe Wei, Wuhan (CN); Song Min Jiang, Wuhan (CN); Dejia Huang, Wuhan (CN); Wen Qiang Chen, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 192 days.

This patent is subject to a terminal disclaimer.

(21) Appl. No.: 17/867,174

(22) Filed: Jul. 18, 2022

(65) Prior Publication Data
US 2022/0351779 A1 Nov. 3, 2022

Related U.S. Application Data (63) Continuation of application No. 16/889,746, filed on Jun. 1, 2020, now Pat. No. 11,423,987, which is a
(Continued)

(51) Int. Cl.
| | | |
|---|---|---|
| G11C 16/16 | (2006.01) | |
| G11C 16/04 | (2006.01) | |
| G11C 16/08 | (2006.01) | |
| G11C 16/10 | (2006.01) | |
| G11C 16/24 | (2006.01) | |

(Continued)

(52) U.S. Cl.
CPC .......... *G11C 16/10* (2013.01); *G11C 16/0408* (2013.01); *G11C 16/08* (2013.01); *G11C 16/24* (2013.01); *G11C 16/28* (2013.01); *G11C 16/30* (2013.01)

(58) Field of Classification Search
CPC .............. G11C 13/004; G11C 11/1659; G11C 11/1673; G11C 11/1675; G11C 13/0004; G11C 13/003; G11C 13/0069; G11C 2013/0045; G11C 2213/79;
(Continued)

(56) References Cited

U.S. PATENT DOCUMENTS

| | | |
|---|---|---|
| 7,944,746 B2 | 5/2011 | Jones |
| 8,988,947 B2 | 3/2015 | Ito |

(Continued)

FOREIGN PATENT DOCUMENTS

| | | |
|---|---|---|
| CN | 1691319 A | 11/2005 |
| CN | 101361134 A | 2/2009 |

(Continued)

*Primary Examiner* — Hien N Nguyen
(74) *Attorney, Agent, or Firm* — BAYES PLLC (57) ABSTRACT

A programming method for a memory device is disclosed. The programming method comprises moving a plurality of first charge carriers at a shallow energy level to a channel in a substrate layer before a programming operation for a first word line, wherein the plurality of first charge carriers at the shallow energy level correspond to a memory cell to be programmed.

20 Claims, 10 Drawing Sheets

Related U.S. Application Data continuation of application No. PCT/CN2020/087794, filed on Apr. 29, 2020.

(51) Int. Cl.
*G11C 16/28* (2006.01)
*G11C 16/30* (2006.01)

(58) Field of Classification Search
CPC ............ G11C 11/1657; G11C 13/0028; G11C 13/0033; G11C 2213/82
See application file for complete search history.

(56) References Cited

U.S. PATENT DOCUMENTS

| | | |
|---|---|---|
| 11,423,987 B2 * | 8/2022 | Liu ..................... G11C 16/10 |
| 2002/0168828 A1 | 11/2002 | Cheng et al. |
| 2009/0001277 A1 | 1/2009 | Payne et al. |
| 2009/0034341 A1 | 2/2009 | Sung et al. |
| 2009/0141557 A1 | 6/2009 | Fujiu |
| 2016/0078949 A1 | 3/2016 | Abe |
| 2019/0198117 A1 | 6/2019 | Yu et al. |

FOREIGN PATENT DOCUMENTS

| | | |
|---|---|---|
| CN | 102222525 A | 10/2011 |
| CN | 102509559 A | 6/2012 |
| CN | 105702863 A | 6/2016 |
| CN | 110838318 A | 2/2020 |
| WO | 2019/108334 A1 | 6/2019 |

* cited by examiner

MEMORY DEVICE AND PROGRAMMING METHOD THEREOF

CROSS-REFERENCE TO RELATED APPLICATIONS

This application is a continuation of U.S. application Ser. No. 16/889,746, filed on Jun. 1, 2020, issued as U.S. Pat. No. 11,423,987, which is a continuation of International Application No. PCT/CN2020/087794, filed on Apr. 29, 2020, both of which are incorporated herein by reference in their entireties.

BACKGROUND

The present disclosure is related to a memory device and its programming method, and more particularly, to a memory device and its programming method of higher reliability and programming quality.

SUMMARY

It is therefore an objective of the present disclosure to provide a memory device and related programming method to improve reliability and programming quality.

The present disclosure discloses a programming method for a memory device. The programming method comprises moving a plurality of first charge carriers at a shallow energy level to a channel in a substrate layer before a fine programming operation for a first word line, wherein the plurality of first charge carriers at the shallow energy level correspond to a memory cell to be programmed.

The present disclosure further discloses a memory device. The memory device comprises a plurality of memory cells, a voltage generation circuit, and a control circuit. The voltage generation circuit is configured to generate a plurality of voltages applied to at least the plurality of memory cells according to a plurality of control signals. The control circuit is configured to generate the plurality of control signals to the voltage generation circuit according to a programming method. The programming method comprises moving charge carriers at a shallow energy level to a channel in a substrate layer before a fine programming operation for a first word line, wherein the plurality of first charge carriers at the shallow energy level correspond to a memory cell to be programmed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

DETAILED DESCRIPTION

Recently, the field of semiconductor memory has received increased attention. Semiconductor memory may be volatile or nonvolatile. A nonvolatile semiconductor memory device can retain data even when not powered and therefore are widely applied in cellular telephones, digital cameras, personal digital assistants, mobile computing devices, non-mobile computing devices and other devices.

A multi-step programming operation may be adopted to make a threshold voltage distribution of data values to be stored less wide. In the multi-step programming operation, a coarse programming operation may be performed before a fine programming operation. The coarse programming operation may form a (rough) threshold voltage distribution. The fine programming operation may finely narrow the (rough) threshold voltage distribution formed by the coarse programming operation. However, undesired redistribution or recombination of charge carriers (for example, the movement of charge carriers at shallow energy level to the channel) can distort the (finished) threshold voltage distribution to cause a threshold voltage shift effect.

Therefore, there is a need to provide a memory device and its programming method that blocks the threshold voltage shift effect after a fine programming operation, thereby improving reliability and programming quality.

The present disclosure aims to avoid undesired redistribution or recombination, which occurs after a fine programming operation, of charge carriers (electrons and/or holes) at a shallow energy level so as to improve reliability and programming quality. For example, redistribution or recombination of charge carriers at the shallow energy level may be triggered intentionally before the fine programming operation.

Figure 1:
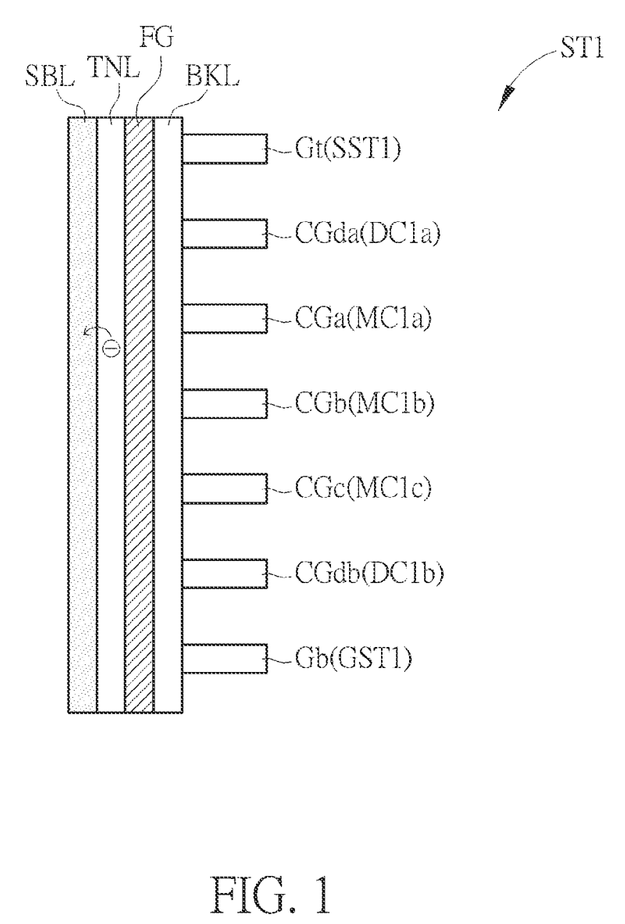
FIG. 1 is a schematic diagram illustrating a cross section view of a string according to an embodiment of the present disclosure.
Figure 2:
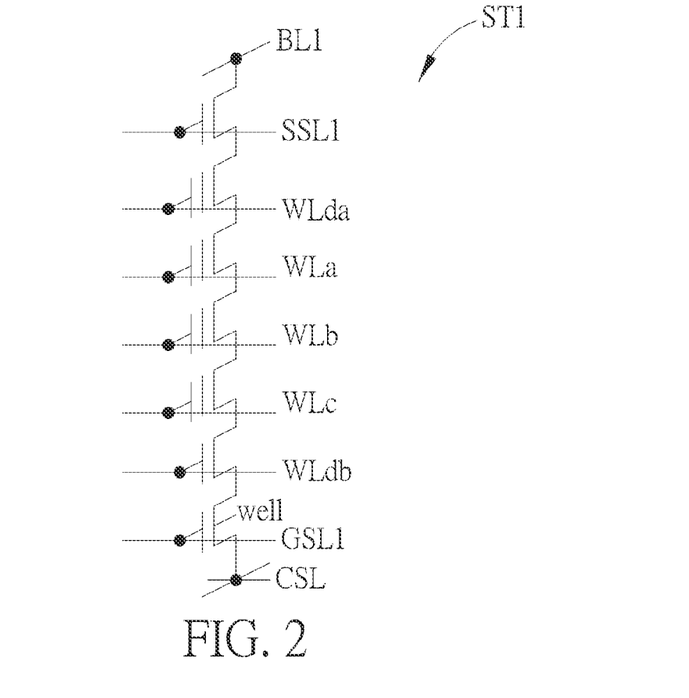
FIG. 2 is a schematic diagram illustrating an equivalent circuit of the string shown in FIG. 1.

FIG. 1 is a schematic diagram illustrating a cross section view of a string ST1 according to an embodiment of the present disclosure. FIG. 2 is a schematic diagram illustrating an equivalent circuit of the string ST1 shown in FIG. 1. The string ST1 may be a NAND string for a flash memory of NAND structure. The string ST1 depicted in FIGS. 1 and 2 includes select cells SST1, GST1, a plurality of dummy cells DC1a, DC1b, and a plurality of memory cells MC1a, MC1b, MC1c. The select cells SST1, GST1, the dummy cell DC1a, DC1b, and the memory cells MC1a to MC1c, which are connected in series, include gates Gt, Gb, control gates CGda, CGdb, CGa, CGb, CGc, a storage layer FG, a block layer BKL, a tunneling layer TNL, and a substrate layer SBL, respectively. The select cell SST1 is configured for connecting the string ST1 to a bit line BL1 and may be controlled by applying appropriate voltages to a string select line SSL1. The select cell GST1 is configured for connecting the string ST1 to a common source line CSL and may be controlled by applying appropriate voltages to a ground selection line GSL1. Each of the control gates CGda, CGdb of the dummy cells DC1a, DC1b is connected to one of a plurality of dummy lines WLda, WLdb, respectively. Each of the control gates CGa to CGc of the memory cells MC1a, MC1b, MC1c is connected to one of a plurality of word lines WLa, WLb, WLc, respectively.

Basically, charge carriers in the string ST1 after programming may be redistributed and leaked over time. For example, just after programming, certain charge carriers at shallow energy level (also referred to as first charge carriers), which may be trapped in the tunneling layer TNL, may migrate to a channel created between a source terminal and a drain terminal in the substrate layer SBL as shown in FIG. 1, and the charge carriers (in the tunneling layer TNL) may lose rapidly. Charge redistribution or recombination (namely, rapid charge carrier loss) may cause a threshold voltage shift effect, which shifts or widens a (finished) threshold voltage distribution of each state or reduces a read margin between two neighboring states. The narrower the read margin between two neighboring states is, the harder the two neighboring states to be clearly differentiated from each other can be. A memory cell (for example, the memory cell MC1b) already verified as having been properly programmed (or erased) may experience the threshold voltage shift effect that essentially changes the programmed (or erased) state of the memory cell.

Figure 3:
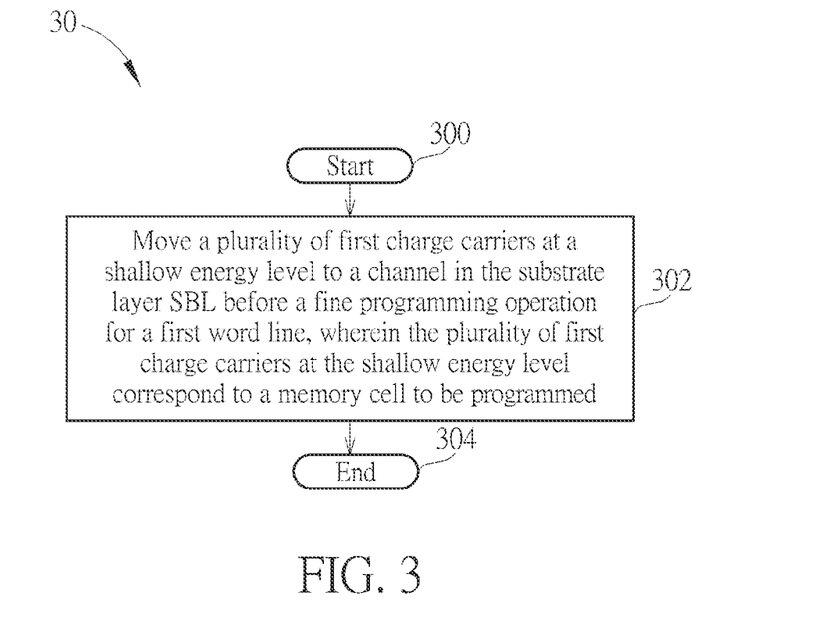
FIG. 3 is a flowchart of a programming method for programming a memory cell of the string shown in FIG. 1 according to an embodiment of the present disclosure.

Charge redistribution may deform and distort the (finished) threshold voltage distribution to cause the threshold voltage shift effect; however, the threshold voltage shift effect on the (finished) threshold voltage distribution may be reduced or eliminated by manipulating the timing of charge redistribution. For example, FIG. 3 is a flowchart of a programming method 30 for programming a memory cell (for example, the memory cell MC1b) of the string ST1 shown in FIG. 1 according to an embodiment of the present disclosure. The programming method 30 may be compiled into a program code. The method 30 may be performed by a control circuit (for example, a control circuit 120 shown in FIG. 11), and include following steps:

Step S300: Start.

Step S302: Move a plurality of first charge carriers at a shallow energy level to a channel in the substrate layer SBL before a fine programming operation for a first word line, wherein the plurality of first charge carriers at the shallow energy level correspond to a memory cell to be programmed.

Step S304: End.

Briefly, the charge carriers at shallow energy level, which correspond to a memory cell (for example, the memory cell MC1b) to be programmed, migrate to the channel in the substrate layer SBL before the fine programming operation, thereby avoiding undesired redistribution or recombination of the charge carriers after the fine programming operation. With a charge redistribution step executed in step S302 before the fine programming operation, the present disclosure provides a satisfactory threshold voltage distribution. Reliability and programming quality can thus be improved.

Specifically, a memory cell (for example, the memory cell MC1b) may be programmed in a multi-step programming operation. In the multi-step programming operation, a coarse programming operation may be performed before a fine programming operation is performed. In step S302, the charge redistribution step may be executed to move charge carriers at shallow energy level back to the channel in the substrate layer SBL before the fine programming operation for a word line (for example, the word line WLb) corresponding to the memory cell to be programmed. In this manner, there are few charge carriers at shallow energy level after the fine programming operation. The threshold voltage shift effect caused by the redistribution of charge carriers at shallow energy level, therefore, seldom occurs after the fine programming operation.

Figure 4:
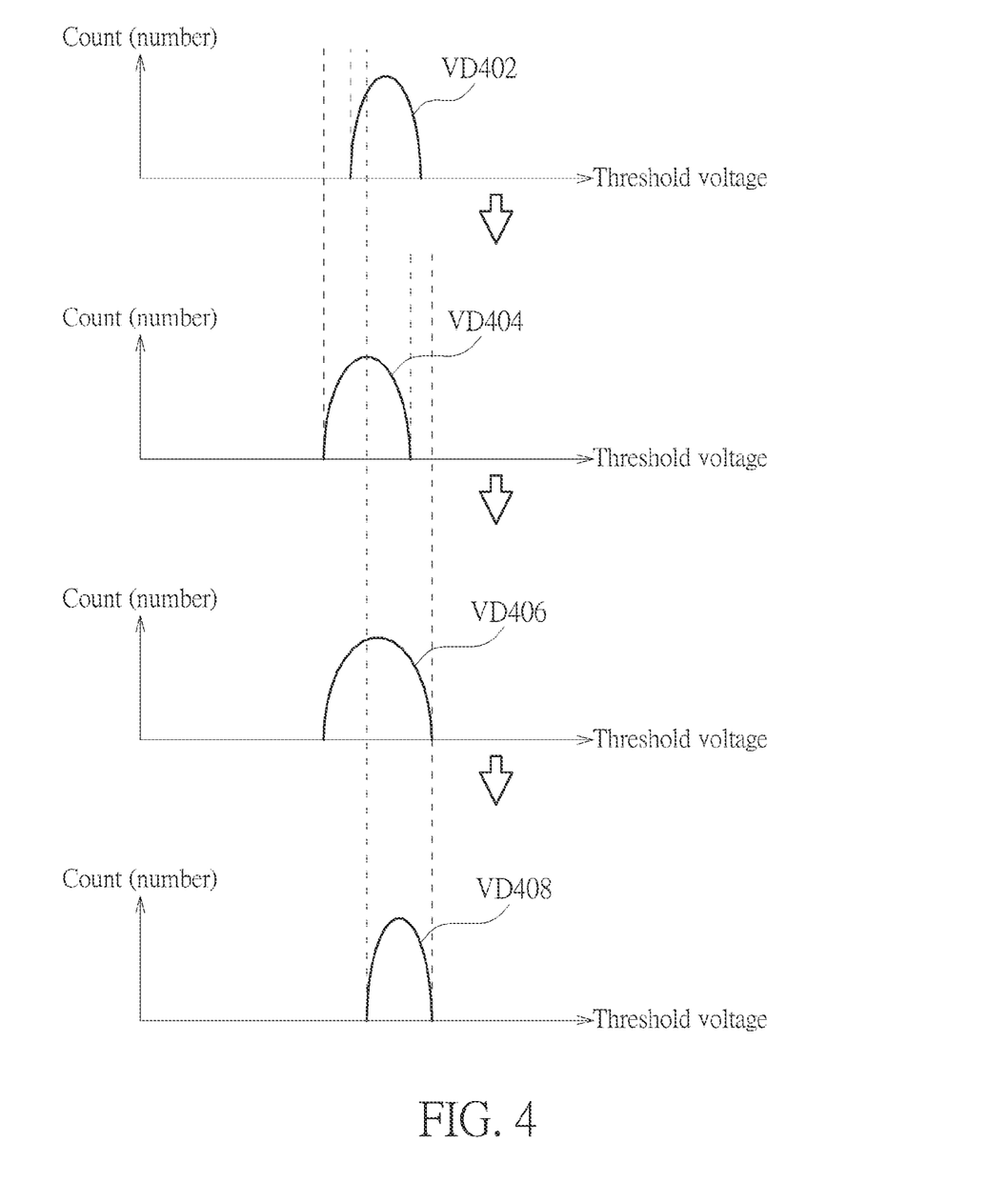
FIGS. 4 and 5 are schematic diagrams each illustrating four threshold voltage distributions for a state according to an embodiment of the present disclosure.

In some embodiments, the charge redistribution step may be executed immediately after a coarse programming operation for a word line (for example, the word line WLb) and before a fine programming operation for the word line (namely, the word line WLb). In other words, the charge carriers at shallow energy level are moved to the channel in the substrate layer SBL immediately after the coarse programming operation for the word line. For instance, FIG. 4 is a schematic diagram illustrating four threshold voltage distributions for a state to be programmed according to an embodiment of the present disclosure. Each of the four threshold voltage distributions has one distribution curve, which corresponds to the same state but represents a step different from another. In FIG. 4, a distribution curve VD402 for the state of memory cells is formed after a coarse programming operation for a word line (for example, the word line WLb). A distribution curve VD404 for the state of memory cells is formed after a charge redistribution step (for example, step S302). A distribution curve VD406 for the state of memory cells is formed after another coarse programming operation for the next word line (for example, the word line WLc). The distribution curve VD408 for the state of memory cells is formed after a fine programming operation for the previous word line (namely, the word line WLb).

As shown in FIG. 4, a width of the distribution curve VD404 is wider than that of the distribution curve VD402, while a width of the distribution curve VD408 is narrower than that of the distribution curve VD404 (and that of the distribution curve VD402). As the distribution curve VD404 for the state expand toward another distribution curve for another state due to charge redistribution, differentiation between the two consecutive states becomes increasingly difficult. The widened distribution curve VD404 may be intolerable for reading data, especially when a read margin between two neighboring states is small. On the other hand, the charge carriers at shallow energy level are moved to the channel in the substrate layer SBL before the fine programming operation, and hence the distribution curve VD408 formed after the fine programming operation would not be distorted by charge redistribution. In order to improve reliability, it is desired for the individual distribution curve in a threshold voltage distribution to be tightened, because the narrower distribution curve results in a wider read margin (namely, the distance between two neighboring states). Since the width of the distribution curve VD408 is and keeps narrow, the distribution curve VD408 for the state may stay far apart from another distribution curve for another state, which improves read margin and ensures reading accuracy of states from memory cells.

Figure 5:
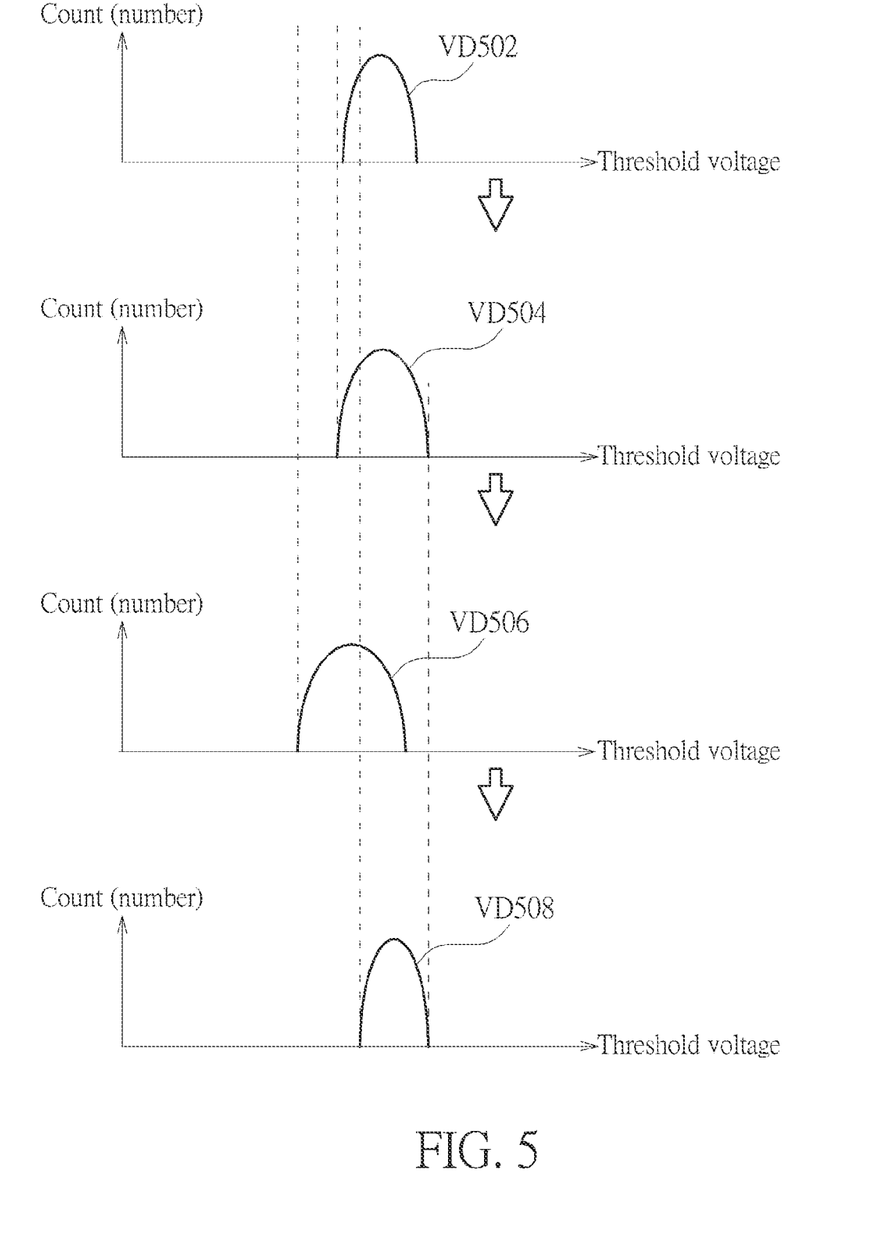

It is noteworthy that those skilled in the art may readily make different alternations and modifications. In some embodiments, the charge redistribution step may be executed before a fine programming operation for a word line (for example, the word line WLb) and immediately after a coarse programming operation for the next word line (namely, the word line WLc). In other words, the charge carriers at shallow energy level are moved to the channel in the substrate layer SBL immediately after the coarse programming operation for the next word line. For instance, FIG. 5 is a schematic diagram illustrating four threshold voltage distributions according to an embodiment of the present disclosure. Each of the four threshold voltage distributions has one distribution curve, which corresponds to the same state but represents a step different from another. In FIG. 5, a distribution curve VD502 for a state of memory cells is formed after a coarse programming operation for a word line (for example, the word line WLb). A distribution curve VD504 for the state of memory cells is formed after another coarse programming operation for the next word line (for example, the word line WLc). A distribution curve VD506 for the state of memory cells is formed after a charge redistribution step (for example, step S302). A distribution curve VD508 for the state of memory cells is formed after a fine programming operation for the previous word line (namely, the word line WLb).

As shown in FIG. 5, a width of the distribution curve VD506 is wider than that of the distribution curve VD502, while a width of the distribution curve VD508 is narrower than that of the distribution curve VD506 (and that of the distribution curve VD502). As the distribution curve VD506 for the state expand toward another distribution curve for another state due to charge redistribution, differentiation between the two consecutive states becomes increasingly difficult. The widened distribution curve VD506 may be intolerable for reading data, especially when a read margin between two neighboring states is small. On the other hand, the charge carriers at shallow energy level are moved to the channel in the substrate layer SBL before the fine programming operation, and hence the distribution curve VD508 formed after the fine programming operation would not be distorted by charge redistribution. In order to improve reliability, it is desired for the individual distribution curve in a threshold voltage distribution to be tightened, because the narrower distribution curve results in a wider read margin (namely, the distance between two neighboring states). Since the width of the distribution curve VD508 is and keeps narrow, the distribution curve VD508 for the state may stay far apart from another distribution curve for another state, which improves read margin and ensures reading accuracy of states from memory cells.

Figure 6:
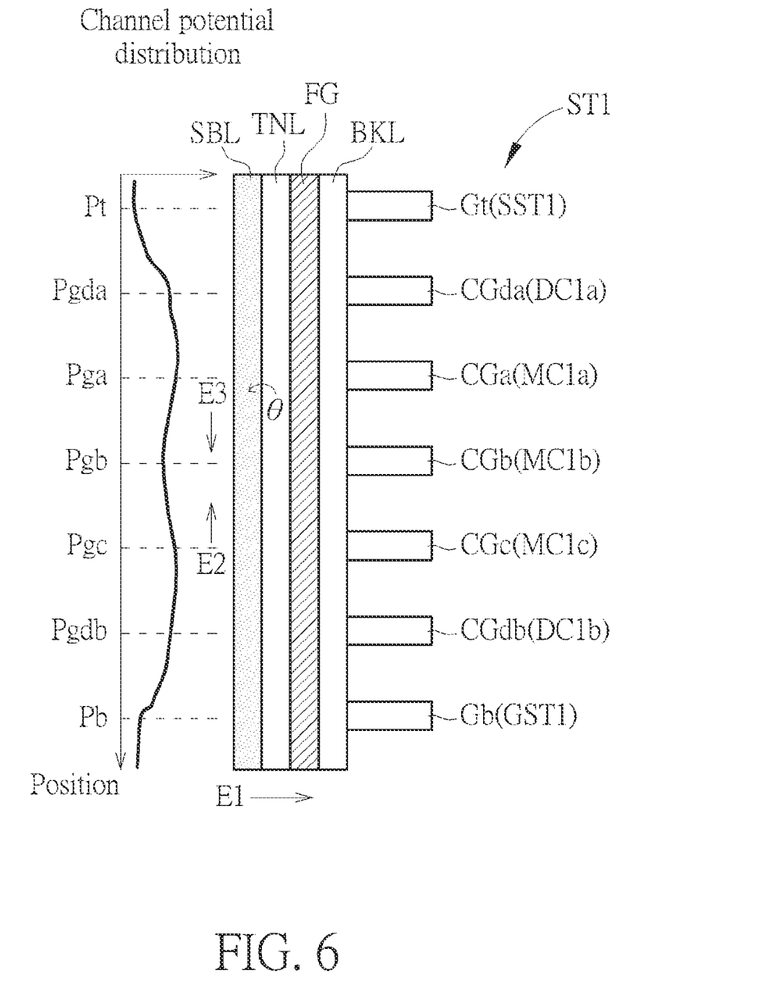
FIG. 6 is a schematic diagram illustrating a cross section view of the string shown in FIG. 1 and a channel potential distribution in the channel of the substrate layer to present electric potential with respect to position.

An electric field may accelerate charge redistribution. Therefore, the charge redistribution step in step S302 may be executed by applying an electric field in some embodiments. For instance, FIG. 6 is a schematic diagram illustrating a cross section view of the string ST1 shown in FIG. 1 and a channel potential distribution in the channel of the substrate layer SBL to present electric potential with respect to position. As shown in FIG. 6, an electric field E1 is applied to the string ST1. The charge carriers at shallow energy level (for example, the charge carriers in the tunneling layer TNL) may move as a result of the applied electric field E1. The direction of the electric field E1 is taken to be the direction of a force it would exert on a positive charge carrier. Accordingly, the electric field E1 forces a negative charge carrier to flow (for example, from the tunneling layer TNL) toward the channel created between the source terminal and the drain terminal in the substrate layer SBL. On the other hand, charge carriers at deep energy level (also referred to as second charge carriers), which may be trapped in the storage layer FG, may be unaffected and show no changes if the magnitude of the electric field E1 is appropriately controlled, such that data stored in a memory cell (for example, the memory cell MC1*b*) would not get lost.

Figure 7:
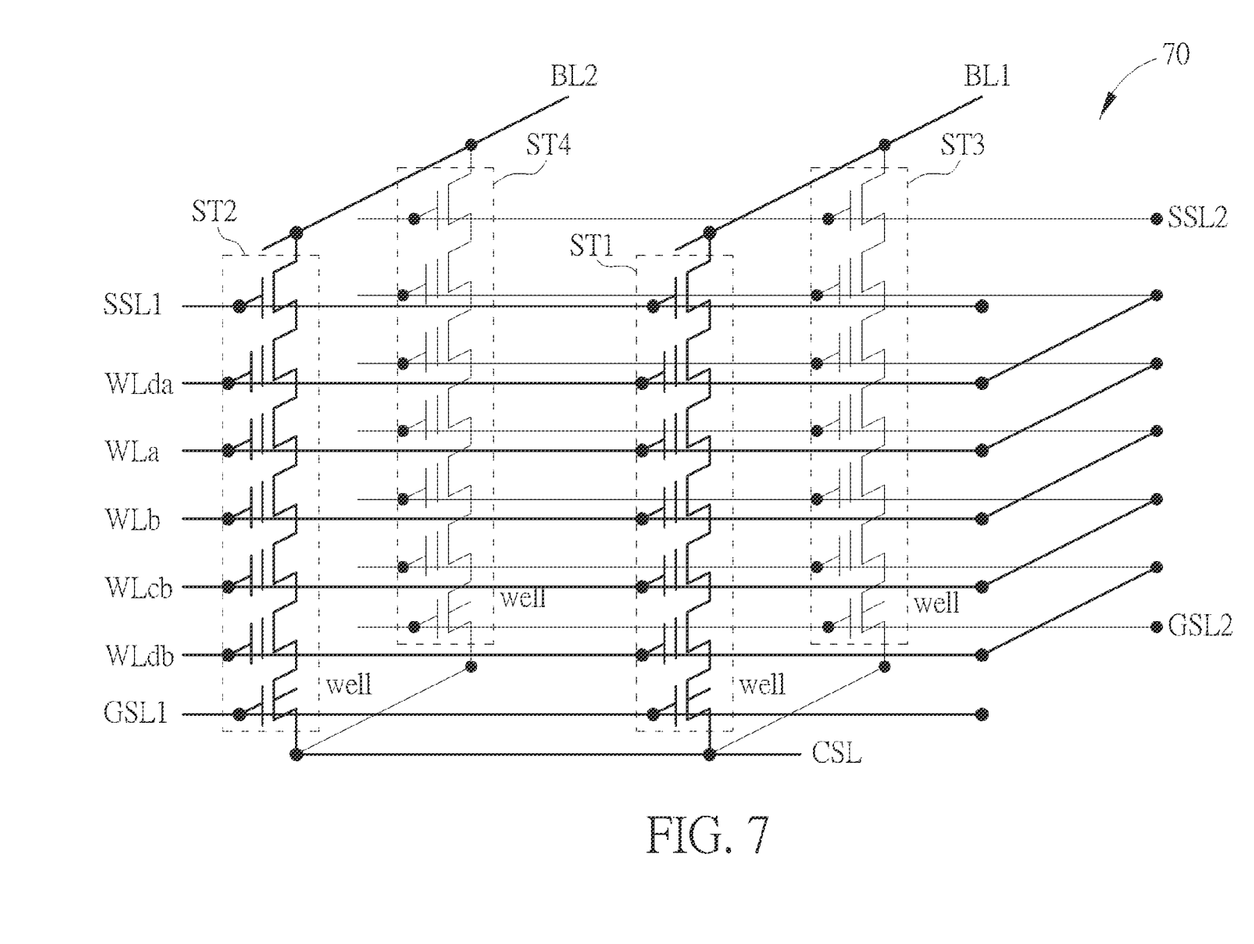
FIG. 7 is a schematic diagram illustrating a memory of NAND structure according to an embodiment of the present disclosure.
Figure 8:
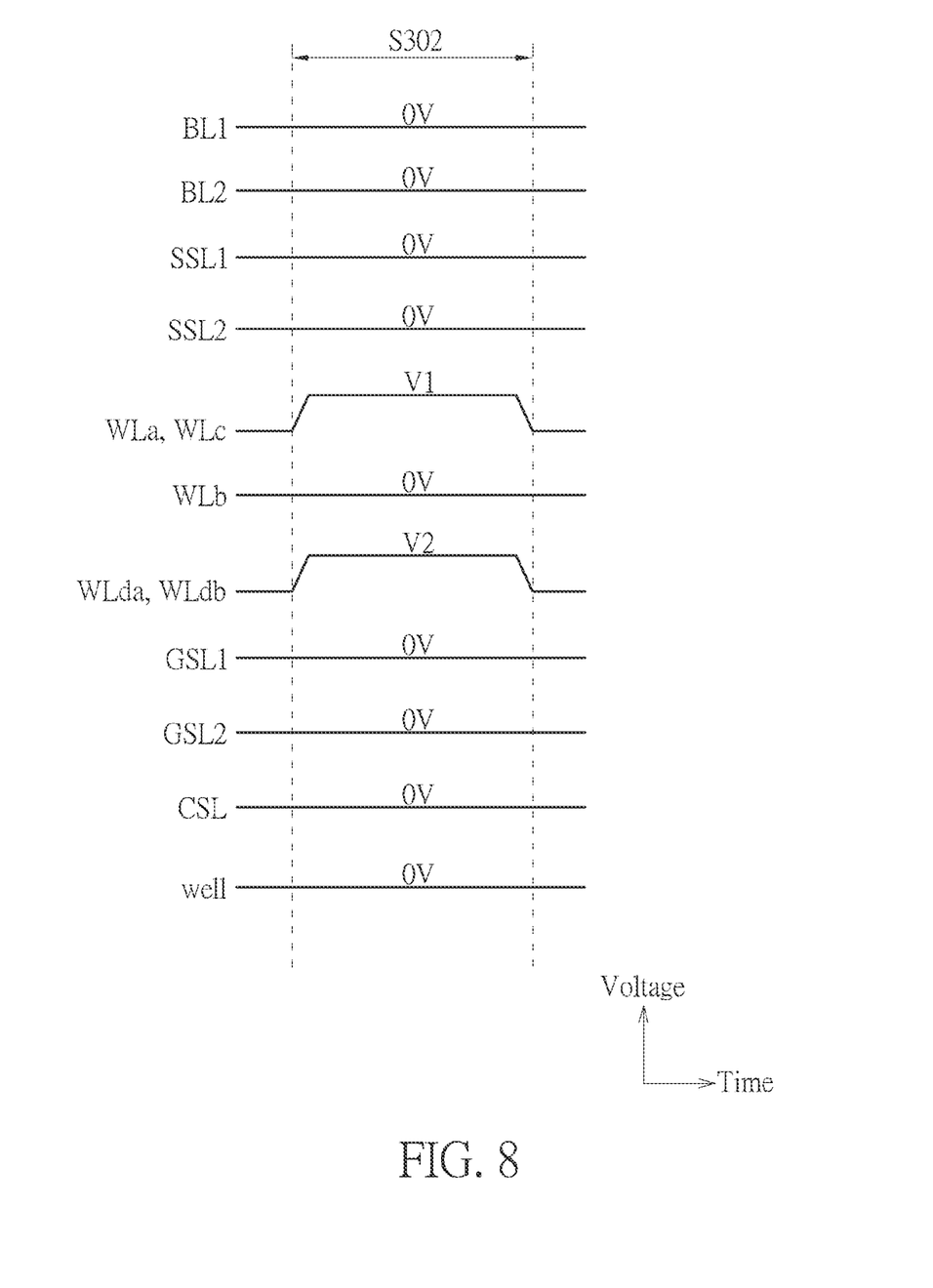
FIGS. 8 and 9 are signal diagrams of a programming method for the memory shown in FIG. 7.

The electric field E1 may be created by applying voltage to the string ST1 so as to accelerate charge redistribution. For instance, please refer to FIG. 6 to FIG. 8. FIG. 7 is a schematic diagram illustrating a memory 70 of NAND structure according to an embodiment of the present disclosure. FIG. 8 is a signal diagram of a programming method (such as the programming method 30) for the memory 70 shown in FIG. 7.

As shown in FIG. 7, the memory 70 may include a plurality of strings such as the string ST1 and strings ST2 to ST4. As the string ST1 shown in FIG. 1, each of the strings ST2 to ST4 depicted in FIG. 7 may include two select cells, two dummy cells, and three memory cells, which are connected in series and extend vertically above the substrate layer SBL, respectively, but is not limited thereto. The select cells disposed on top of the strings ST2 to ST4 are configured for connecting the strings ST2 to ST4 to (the) bit lines BL1, BL2 and may be controlled by applying appropriate voltages to (the) string select lines SSL1, SSL2, respectively. The select cells disposed at the bottom of the strings ST2 to ST4 are configured for connecting the strings ST2 to ST4 to the common source line CSL and may be controlled by applying appropriate voltages to (the) ground selection line GSL1, GSL2, respectively. Control gates of dummy cells in the strings ST2 to ST4 are connected to the dummy lines WLda, WLdb, respectively. Control gates of memory cells in the strings ST2 to ST4 are connected to the word lines WLa, WLb, WLc, respectively. Typically, the bit lines BL1, BL2 run on top of the strings ST1 to ST4 in a direction perpendicular to the word lines WLa, WLb, WLc.

Those skilled in the art would appreciate that either a 2-dimensional planer memory structure, a 3-dimensional stacked structure, a NAND flash memory structure and/or a NOR flash memory structure may be implemented in the memory 70. Moreover, for illustrative purpose, FIGS. 1, 2, 6, and 7 show three memory cells in the string ST1. In other embodiments, one string may include more memory cells. The number of memory cells in one string does not limit the scope of the present disclosure. In addition, the memory cells (such as the memory cells MC1*a* to MC1*c*) in the strings ST1 to ST4 may be floating-gate transistors or charge-trapping transistors. Each memory cell may store 1-bit data or two or more bits of data, and thus may be of a single-level cell (SLC) type, a multi-level cell (MLC) type, a triple-level cell (TLC) type, a quad-level cell (QLC) type, or a higher-level type. Each memory cell may hold one of Q possible states, where Q is a positive integer equal to or greater than 2, generally with Q=2 for an SLC, Q=4 for an MLC, Q=8 for a TLC, and Q=16 for a QLC.

A memory cell may be programmed into a target programming state (also referred to as program state) using the multi-step programming operation. The multi-step programming operation involves a sequence starting from an initial programming level and proceeding to a target programming level until the threshold voltage of the selected memory cell (for example, the memory cell MC1*b*) reaches one respective verification voltage level of the target programming state. During a coarse programming operation or a fine programming operation, a programming pulse (for example, of 20 volts) may be applied to a selected word line (for example, the word line WLb) to set the selected memory cell (namely, the memory cell MC1*b*) corresponding to the selected word line to the respective target programming state. The unselected word line(s) (for example, the word lines WLa, WLc) are subject to, for instance, 10 volts. Besides, a turn-on voltage (for example, 1.5 volts or 3 volts) may be applied to the string select line (for example, the string select line SSL1) to turn on the respective select cells (for example, the select cells SST1), and a turn-off voltage (for example, 0 volts) may be applied to the ground selection line (for example, the ground selection line GSL1) to turn off the respective select cells (for example, the select cells GST1). When the selected memory cell is programmed, a ground voltage (for example, 0 volts) may be exerted on the selected bit line (for example, the bit line BL1) corresponding to the selected memory cell, while a supply voltage (for example, 1.5 volts or 3 volts) may be exerted on the unselected bit line(s) (for example, the bit line BL2) corresponding to the unselected memory cell(s). As a result, charge carriers may be injected into the storage layer FG (or sometimes the tunneling layer TNL). When charge carriers accumulate in the storage layer FG, the threshold voltage of the selected memory cell raises so that the selected memory cell is in a programmed state.

As shown in FIG. 7 and FIG. 8, during the charge redistribution step executed in step S302, the applied voltages changes to create the channel potential distribution shown in FIG. 6, resulting in the electric field E1. As shown in FIG. 8, the turn-off voltage may be applied to the ground selection lines GSL1, GSL2 and the string select lines SSL1, SSL2 to turn off the select cells GST1, GST2, SST1, and SST2 for the charge redistribution step. The ground voltage may be exerted on the bit lines BL1, BL2 and the common source line CSL such that the bit lines BL1, BL2 and the common source line CSL are grounded. A well (not shown) of the substrate layer SBL is subject to, for instance, 0 volts and thus be grounded as well. The voltage applied to a selected word line (for example, the word line WLb) corresponding to the selected memory cell (namely, the memory cell MC1b) approximates 0 volts as the selected word line is grounded. The voltage applied to unselected word line(s) (for example, the word lines WLa, WLc) corresponding to the unselected memory cell(s) (for example, the memory cells MC1a, MC1c) may reach (or increase to) a first nonzero voltage V1. The first nonzero voltage V1 may be in a range of 5 volts to 10 volts. The first nonzero voltage V1 may be larger than 0 volts but lower than the voltage of the programming pulse. The voltage applied to the dummy lines WLda, WLdb corresponding to the dummy cells (for example, the dummy cells DC1a, DC1b) of the strings ST1 to ST4 may reach (or increase to) a second nonzero voltage V2. The second nonzero voltage V2 may be in a range of 0 volts to 5 volts. The second nonzero voltage V2 may be larger than 0 volts but lower than the first nonzero voltage V1.

During the charge redistribution step, since the select cells GST1, GST2, SST1, SST2 for all the strings (for example, the strings ST1 to ST4) are turned off, the channel in the substrate layer SBL is floating. The voltages applied to the dummy lines WLda, WLdb and the unselected word lines WLa, WLc are nonzero, which increases the channel potential of the dummy cells DC1a, DC1b and the unselected memory cells MC1a, MC1c. As shown in FIG. 6, a channel potential of the memory cell MC1a at a position Pga or a channel potential of the memory cell MC1c at a position Pgc is higher than a channel potential at a position Pt or Pb. In some embodiment, the channel potential at the position Pga or Pgc is higher than a channel potential at a position Pgda or Pgdb, and the channel potential at the position Pgda or Pgdb is higher than the channel potential at the position Pt or Pb. In some embodiment, the channel potential at the position Pgda or Pgdb is lower than the voltage applied to the dummy line WLda or WLdb, and the channel potential at the position Pga or Pgc is lower than the voltage applied to the unselected word line WLa or WLc.

Although the voltage applied to the selected word line WLb corresponding to the selected memory cell MC1b is equal to 0 volts, the channel potential of the memory cell MC1b at a position Pgb may be higher than 0 volts. It is because equivalent channels of the dummy cells DC1a, DC1b and the unselected memory cells MC1a, MC1c is connected to an equivalent channel of the selected memory cell MC1b—more specifically, the channel in the substrate layer SBL is continuous. Accordingly, the channel potentials of the dummy cells DC1a, DC1b and the unselected memory cells MC1a, MC1c may make the channel potential of the selected memory cell MC1b at the position Pgb nonzero. In some embodiment, the channel potential at the position Pgb is lower than the channel potential at the position Pga, Pgc, Pgda, or Pgdb but higher than 0 volts as a result of the channel potential at the position Pgb being pulled up by the neighboring channel potential at the position Pga or Pgc. In this manner, the electric field E1 directed from the channel in the substrate layer SBL to the tunneling layer TNL (and, potentially, lateral fields E2 and E3) is induced to accelerate the movement of the charge carriers at shallow energy level to the channel.

It is noteworthy that the first nonzero voltage V1 for the unselected word lines WLa, WLc and the second nonzero voltage V2 for the dummy lines WLda, WLdb may be determined and optimized according to experiment data or simulation results, such that the charge carriers at deep energy level may not migrate to the channel in the substrate layer SBL as the charge carriers at shallow energy level. That is to say, when the electric field E1 is appropriately controlled, the charge carriers at deep energy level are prohibited from migrating to the channel in the substrate layer SBL. The charge carriers at deep energy level may remain and be still trapped in the storage layer FG. Consequently, data stored in the memory cell MC1b would not get lost or be erased. For further understanding, a shallow energy level is close to (a band edge of) a conduction band, for example, with an energy difference less than kBT (Boltzmann constant times temperature) with respect to conduction band edge. A deep energy level in a semiconductor generally describes a level further away from a conduction band or a valence band, and the energy difference is much larger than kBT. A deep energy level may be near the center of a band gap.

As set forth above, before the fine programming operation, the charge redistribution step is executed to rapidly move the charge carriers at shallow energy level to the channel in the substrate layer SBL with the voltage applied to the selected word line WLb corresponding to the selected memory cell MC1b approaching 0 volts and the channel potential of the selected memory cell MC1b higher than 0 volts. Since the distribution curve designated for each state (for example, the distribution curve VD408 or VD508) in the (finished) threshold voltage distribution must necessarily be made narrower and placed closer together as the number of states stored on each memory cell increases, programming a selected memory cell must be performed with an increased degree of precision and the extent of any post shifts in the (finished) threshold voltage distribution that can be tolerated is reduced. According to the present disclosure, there are few charge carriers at shallow energy level after the fine programming operation; consequently, the threshold voltage shift effect caused by the redistribution of the charge carriers at shallow energy level seldom occurs after the fine programming operation. With the charge redistribution step performed before the fine programming operation, reliability and programming quality can thus be improved.

Figure 9:
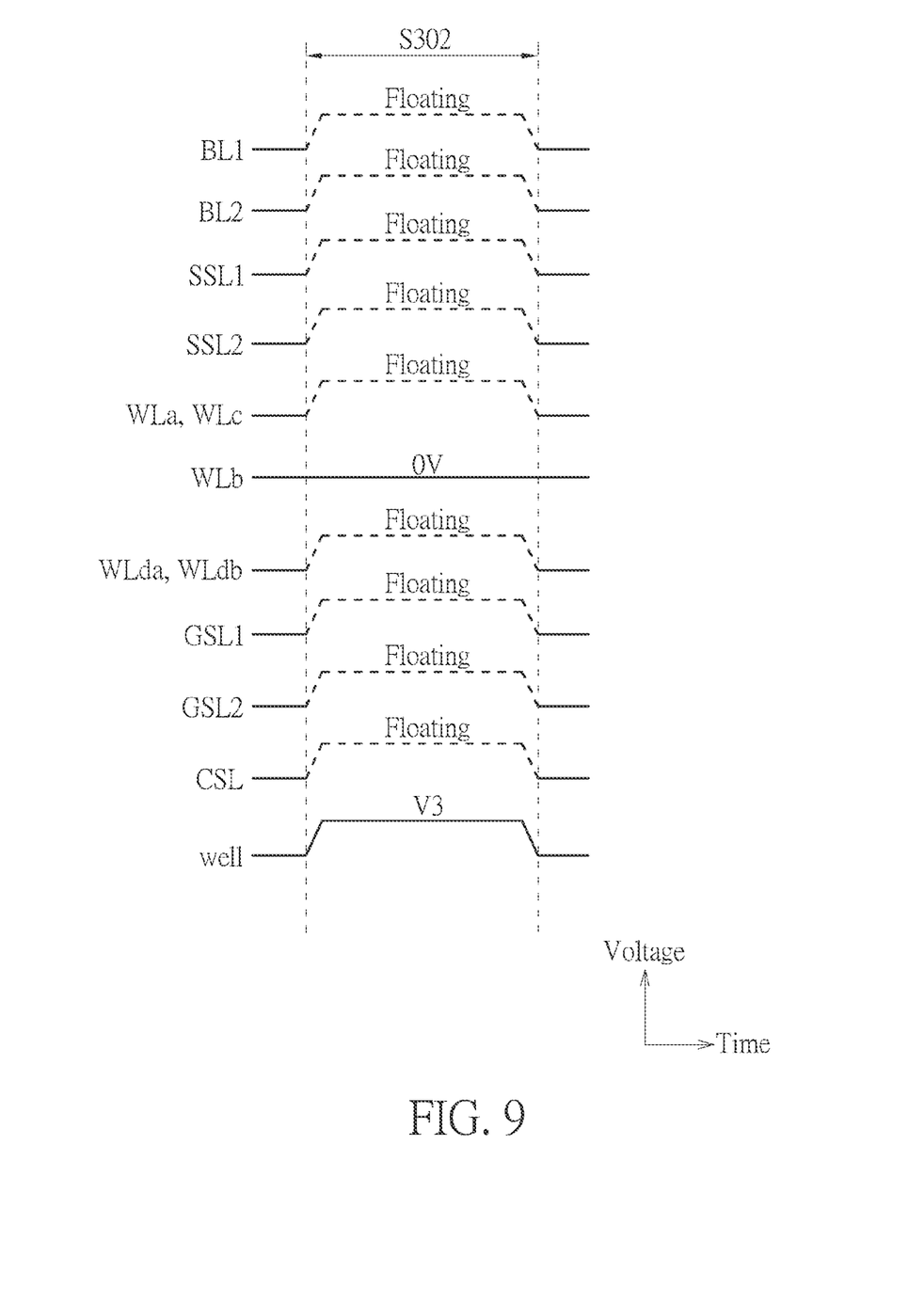

Alternatively, the electric field E1 may be created by applying voltage to the string ST1 as an erasing operation so as to accelerate charge redistribution. For instance, please refer to FIG. 7 and FIG. 9. FIG. 9 is a signal diagram of a programming method (such as the programming method 30) for the memory 70 shown in FIG. 7.

As shown in FIG. 7 and FIG. 9, during the charge redistribution step executed in step S302, the ground voltage may be exerted on a selected word line (for example, the word line WLb) corresponding to the selected memory cell (namely, the memory cell MC1b) such that the selected word line is grounded as shown in FIG. 8. Unlike the signal diagram shown in FIG. 8, during the charge redistribution step, the voltage applied to the well of the substrate layer SBL may reach (or increase to) a third nonzero voltage V3. The third nonzero voltage V3 may be in a range of 5 volts to 10 volts. The third nonzero voltage V3 may be larger than 0 volts but lower than the voltage of the programming pulse. Moreover, the ground selection lines GSL1, GSL2, the string select lines SSL1, SSL2, the bit lines BL1, BL2, the common source line CSL, the dummy lines WLda, WLdb corresponding to the dummy cells (namely, the dummy cells DC1a, DC1b) of the strings ST1 to ST4, and the unselected word line(s) (for example, the word lines WLa, WLc) corresponding to the unselected memory cell(s) (namely, the memory cells MC1a, MC1c) are floating during the charge redistribution step. Since all of the ground selection lines GSL1, GSL2, the string select lines SSL1, SSL2, the bit lines BL1, BL2, the common source line CSL, the dummy lines WLda, WLdb, and unselected word line WLa, WLc are put in a floating state, the corresponding elements of the strings ST1 to ST4 are also raised to nonzero voltages, for example, due to a capacitive coupling with the well.

By raising the well to the third nonzero voltage V3 (similar to an erase voltage of 20V or less) and grounding the word line selected word line WLb corresponding to the selected memory cell MC1b, the tunneling layer TNL to the channel in the substrate layer SBL directed from the electric field E1is induced to accelerate the movement of the charge carriers at shallow energy level to the channel. In other words, the charge carriers at shallow energy level are "erased".

It is noteworthy that the third nonzero voltage V3 for the well of the substrate layer SBL may be determined and optimized according to experiment data or simulation results, such that the charge carriers at deep energy level may not migrate to the channel in the substrate layer SBL as the charge carriers at shallow energy level. That is to say, when the electric field E1 is appropriately controlled, the charge carriers at deep energy level are prohibited from migrating to the channel in the substrate layer SBL. The charge carriers at deep energy level may remain and be still trapped in the storage layer FG. Consequently, data stored in the memory cell MC1b would not get lost or be erased.

As set forth above, before a fine programming operation, the charge redistribution step is executed to rapidly move the charge carriers at shallow energy level to the channel in the substrate layer SBL with the voltage applied to the selected word line WLb corresponding to the selected memory cell MC1b approaching 0 volts and the voltage applied to the well is higher than 0 volts. Since the distribution curve designated for each state (for example, the distribution curve VD408 or VD508) in the (finished) threshold voltage distribution must necessarily be made narrower and placed closer together as the number of states stored on each memory cell increases, programming a selected memory cell must be performed with an increased degree of precision and the extent of any post shifts in the (finished) threshold voltage distribution that can be tolerated is reduced. According to the present disclosure, there are few charge carriers at shallow energy level after the fine programming operation; consequently, the threshold voltage shift effect caused by the redistribution of the charge carriers at shallow energy level seldom occurs after the fine programming operation. With the charge redistribution step performed before the fine programming operation, reliability and programming quality can thus be improved.

Figure 10:
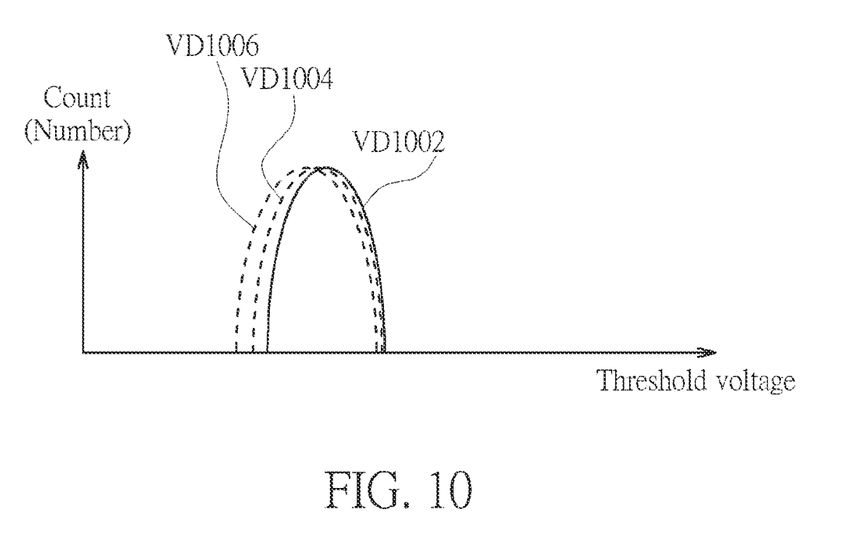
FIG. 10 is a schematic diagram illustrating a comparison among a threshold voltage distribution just after programming, a threshold voltage distribution after programming for awhile using a conventional programming method, and a threshold voltage distribution after programming for a while using a new programming method with a charge redistribution step according to an embodiment of the present disclosure.

FIG. 10 is a schematic diagram illustrating a comparison among a threshold voltage distribution just after programming, a threshold voltage distribution after programming for a while using a conventional programming method, and a threshold voltage distribution after programming for a while using a new programming method with a charge redistribution step according to an embodiment of the present disclosure. The threshold voltage distribution including a distribution curve VD1002 for a state of programmed memory cells is formed just after programming. The threshold voltage distribution including a distribution curve VD1004 for the state is formed after programming the memory cells for a while by means of a new programming method of the present disclosure with a charge redistribution step executed before the fine programming operation. The threshold voltage distribution including a distribution curve VD1006 for the state is formed after programming the memory cells for a while by means of a conventional programming method without the charge redistribution step.

As shown in FIG. 10, either a width of the distribution curve VD1004 or a width of the distribution curve VD1006 is wider than a width of the distribution curve VD1002 because undesired redistribution or recombination of the charge carriers at shallow energy level can cause the threshold voltage shift effect and thus distort the (finished) threshold voltage distribution (namely, the distribution curve VD1002). As time goes on, the threshold voltage shift effect can be even severe. However, the width of the distribution curve VD1004 is narrower than that of the distribution curve VD1006. Since the distribution curve VD1006 for the state expand toward another distribution curve for another state in the threshold voltage distribution of a conventional programming method due to charge redistribution, differentiation between the two consecutive states becomes increasingly difficult. The widened distribution curve VD1006 may be intolerable for reading data, especially when a read margin between two neighboring states is small. On the other hand, the charge carriers at shallow energy level are moved to the channel in the substrate layer SBL before the fine programming operation, and hence the distribution curve VD1004 in the threshold voltage distribution of the new programming method of the present disclosure would not be distorted intensely by charge redistribution even formed after programming the memory cells for a while. Since the width of the distribution curve VD1004 is and keeps narrow, the distribution curve VD1004 for the state may stay far apart from another distribution curve for another state, which improves read margin and ensures reading accuracy of states from memory cells.

Figure 11:
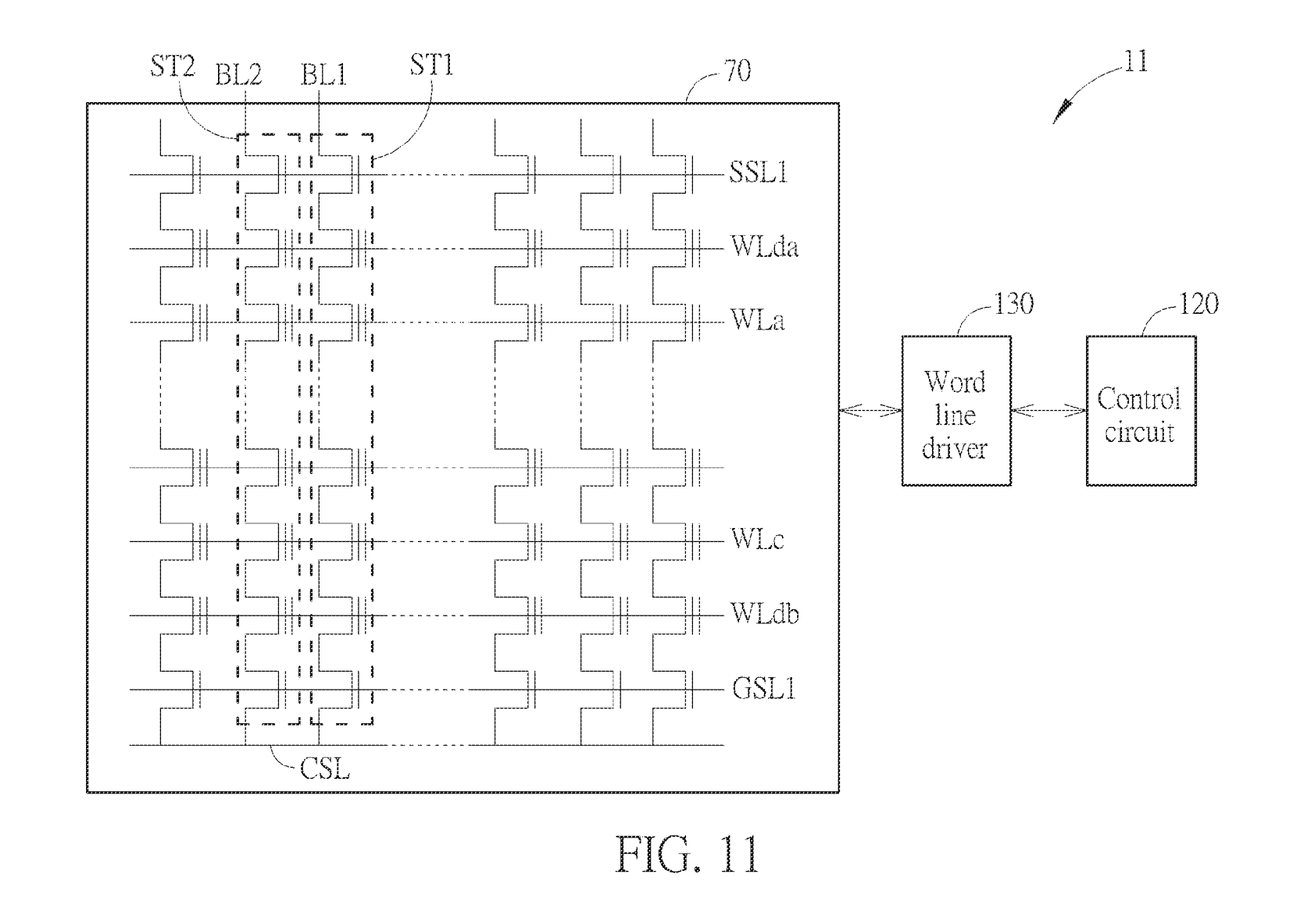
FIG. 11 is a functional block diagram of a memory device according to an embodiment of the present disclosure.

FIG. 11 is a functional block diagram of a memory device 11 according to an embodiment of the present disclosure. The memory device 11 includes the memory 70 shown in FIG. 7, the aforementioned control circuit 120 and a voltage generation circuit 130. The control circuit 120 is configured to generate a plurality of control signals to the voltage generation circuit 130 so as to perform a programming operation or a charge redistribution step. The control circuit 120 may be a controller, an embedded microprocessor, a microcontroller, or the like. The voltage generation circuit 130 is coupled to the control circuit 120 and the memory 70, and configured to generate a plurality of voltages applied to the bit lines BL1, BL2, the string select lines SSL1, SSL2, the ground selection line GSL1, GSL2, the word lines WLa, WLb, WLc, the dummy lines WLda, WLdb, the common source line CSL, and the well of the substrate layer SBL (namely, the voltages applied to at least the memory cells MC1a, MC1b, MC1c) according to the control signals generated by the control circuit 120.

In summary, the charge carriers at shallow energy level, which correspond to a memory cell to be programmed, migrate to the channel in the substrate layer before the fine programming operation, thereby avoiding undesired redistribution or recombination of the charge carriers after the fine programming operation. With a charge redistribution step performed before the fine programming operation, the present disclosure provides a satisfactory threshold voltage distribution. Reliability and programming quality can thus be improved.

Those skilled in the art will readily observe that numerous modifications and alterations of the device and method may be made while retaining the teachings of the disclosure. Accordingly, the above disclosure should be construed as limited only by the metes and bounds of the appended claims.

The invention claimed is:

1. A memory device, comprising:
memory cells comprising:
a selected memory cell;
a first unselected memory cell; and
a second unselected memory cell; and
a control logic coupled to the memory cells, wherein the control logic is configured to:
before a programming operation, apply a ground voltage to a selected word line corresponding to the selected memory cell; and
apply a first voltage to a first unselected word line corresponding to the first unselected memory cell and a second unselected word line corresponding to the second unselected memory cell.

2. The memory device of claim 1, wherein the first voltage is in a range of 5 to 10 V.

3. The memory device of claim 1, wherein the first voltage is lower than a programming voltage applied to the selected word line during the programming operation.

4. The memory device of claim 1, further comprising:
a first dummy cell; and
a second dummy cell, wherein the first unselected memory cell and the second unselected memory cell are between the first dummy cell and the second dummy cell, wherein the control logic is further configured to:
before the programming operation, apply a second voltage to a first dummy word line corresponding to the first dummy cell and a second dummy word line corresponding to the second dummy cell, wherein the first voltage is higher than the second voltage.

5. The memory device of claim 4, wherein the second voltage is in a range of 0 to 5 V.

6. The memory device of claim 5, further comprising:
a string select cell; and
a ground select cell, wherein the control logic is further configured to:
before the programming operation, apply a third voltage to a string select line corresponding to the string select cell; and
apply a fourth voltage to a ground select line corresponding to the ground select cell, wherein the third voltage and the fourth voltage is lower than the second voltage.

7. The memory device of claim 6, wherein the third voltage and the fourth voltage are ground voltage.

8. A memory device, comprising:
memory cells comprising:
a selected memory cell; and
a well of a substrate layer; and
a control logic coupled to the memory cells, wherein the control logic is configured to:
before a programming operation, apply a ground voltage to a selected word line corresponding to the selected memory cell; and
apply a first voltage to the well of the substrate layer.

9. The memory device of claim 8, wherein the first voltage is in a range of 5 to 10 V.

10. The memory device of claim 8, further comprising:
a first unselected memory cell; and
a second unselected memory cell, wherein the control logic is further configured to:
before the programming operation, floating a first unselected word line corresponding to the first unselected memory cell, and a second unselected word line corresponding to the second unselected memory cell.

11. The memory device of claim 10, further comprising:
a first dummy cell; and
a second dummy cell, wherein the first unselected memory cell and the second unselected memory cell are between the first dummy cell and the second dummy cell, wherein the control logic is further configured to:
before the programming operation, floating a first dummy word line corresponding to the first dummy cell, and a second dummy word line corresponding to the second dummy cell.

12. The memory device of claim 10, further comprising:
a string select cell; and
a ground select cell, wherein the control logic is further configured to:
before the programming operation, floating a string select line corresponding to the string select cell, and a ground select line corresponding to the ground select cell.

13. A method for operating a memory device, comprising:
before a first programming operation, applying a ground voltage to a selected word line corresponding to a selected memory cell; and
applying a first voltage to a first unselected word line corresponding to a first unselected memory cell and a second unselected word line corresponding to a second unselected memory cell.

14. The method of claim 13, wherein the first voltage is in a range of 5 to 10 V.

15. The method of claim 13, further comprising:
before the first programming operation, applying a second voltage to a first dummy word line corresponding to a first dummy cell and a second dummy word line corresponding to a second dummy cell, wherein the first voltage is higher than the second voltage, and the first unselected memory cell and the second unselected memory cell are between the first dummy cell and the second dummy cell.

16. The method of claim 15, wherein the second voltage is in a range of 0 to 5 V.

17. The method of claim 16, further comprising:
before the first programming operation, applying a third voltage to a string select line corresponding to a string select cell; and
applying a fourth voltage to a ground select line corresponding to a ground select cell, wherein the third voltage and the fourth voltage is lower than the second voltage.

18. The method of claim 17, wherein the third voltage and the fourth voltage are ground voltage.

19. The method of claim 13, wherein performing the first programming operation comprises applying a first programming voltage to the selected word line.

20. The method of claim 19, wherein applying the ground voltage to the selected word line corresponding to the selected memory cell and applying the first voltage to the first unselected word line corresponding to the first unselected memory cell and the second unselected word line corresponding to the second unselected memory cell are after performing a second programming operation, wherein performing the second programming operation comprises applying a second programming voltage to the selected word line.

\* \* \* \* \*